(12) United States Patent (10) Patent No.: US 7,346,146 B2
Rütten et al. (45) Date of Patent: Mar. 18, 2008

(54) X-RAY DETECTOR WITH PHOTO-GATES AND DOSE CONTROL

(75) Inventors: Walter Rütten, Linnich (DE); Michael Overdick, Langerwehe (DE)

(73) Assignee: Koninklijke Philips Electronic, N.V., Eindhoven (NL)

( * ) Notice: Subject to any disclaimer, the term of this patent is extended or adjusted under 35 U.S.C. 154(b) by 0 days.

(21) Appl. No.: 10/597,751

(22) PCT Filed: Feb. 1, 2005

(86) PCT No.: PCT/IB2005/050418

§ 371 (c)(1),
(2), (4) Date: Aug. 7, 2006

(87) PCT Pub. No.: WO2005/078477

PCT Pub. Date: Aug. 25, 2005

(65) Prior Publication Data

US 2007/0158572 A1 Jul. 12, 2007

(30) Foreign Application Priority Data

Feb. 11, 2004 (EP) .................................. 04100512

(51) Int. Cl.
*H05G 1/64* (2006.01)

(52) U.S. Cl. ....................................... 378/98.8; 378/97
(58) Field of Classification Search .................. 378/19, 378/98.8, 97; 250/370.08, 370.09, 370.11
See application file for complete search history.

(56) References Cited

U.S. PATENT DOCUMENTS

| 5,055,667 | A | 10/1991 | Sayag | 250/208.1 |
|---|---|---|---|---|
| 5,937,027 | A | 8/1999 | Thevenin et al. | 378/98.8 |
| 6,326,230 | B1 | 12/2001 | Pain et al. | 438/57 |
| 6,404,851 | B1 | 6/2002 | Possin et al. | 378/98.7 |
| 6,555,842 | B1 | 4/2003 | Fossum et al. | 257/59 |
| 2002/0181648 | A1 | 12/2002 | Ruetten et al. | |

FOREIGN PATENT DOCUMENTS

WO WO200225314 3/2002

*Primary Examiner*—Courtney Thomas

(57) ABSTRACT

The invention relates to a radiation detector apparatus (10) with an array (12) of detector pixels. Each pixel (20) of the detector comprises a photogate electrode (21) under which electrical charges produced by incident radiation (v, X) are collected. The change of these charges gives rise to displacement currents in photogate lines (32) connected to the photogate electrodes (21) which may be monitored by current sensors (40). Thus the charges collected by all photogate electrodes (21) connected to a photogate line (32) can be measured during an ongoing exposure, allowing for advanced dose control methods of the illumination.

10 Claims, 1 Drawing Sheet

X-RAY DETECTOR WITH PHOTO-GATES AND DOSE CONTROL

The invention relates to a radiation detector apparatus with an array of detector pixels, an X-ray examination apparatus, a method for controlling such an examination apparatus, and a method for monitoring the dose which is collected by at least one pixel of a radiation detector apparatus.

Flat dynamic X-ray detectors (FDXDs) are increasingly used in the field of medical diagnostics as universal detector components which can be employed in different application-specific X-ray devices. Flat dynamic X-ray detectors are typically manufactured with a sensor matrix of amorphous silicon (a-Si:H), wherein every sensor element of the matrix contains an element for charge collection, for example a photodiode or a capacitor, and at least one readout element, for example a thin film transistor.

From the WO 02/25314 A1 a FDXD is known in which the detector surface is divided into dose measuring arrays ("super-pixel"). Every dose measuring array contains several sensor elements of the sensor matrix, and a small measuring or "tapping" capacitor in each of said sensor elements is connected via a dose sensing line to a charge-sensitive, dose sensing amplifier. Already during the X-ray illumination the mean value of the dose can be determined at the output of the dose sensing amplifier for each dose measuring array without negative influence on the later readout of a high-resolution picture. The dose signals can especially be used to control the correct illumination of the X-ray images.

For X-ray detectors based on monocrystalline semiconductors (e.g. detectors in CMOS technology) that comprise so-called photogates as part of charge storage elements, there is no possibility to connect small measuring capacitors. This is because the photogates collect charges under electrodes which are separated by an isolating layer from the semiconductor substrate (bulk material).

Based on this situation it was an object of the present invention to provide means for an improved illumination control in a radiation detector with photogates.

This object is achieved by a radiation detector apparatus with, e.g., an array of detector pixels according to the present disclosure, an X-ray examination apparatus with an X-ray source and an X-ray detector apparatus according to the present disclosure, a method for controlling an X-ray examination apparatus in accordance with the present disclosure, and/or a method for monitoring collected doses in accordance with the present disclosure.

The radiation detector apparatus according to the present invention contains an array of detector pixels. The pixels are typically arranged in a regular, for example rectangular or hexagonal pattern on the surface of the detector. Every pixel is used for the generation of an individual image signal which defines one point or picture element of the image produced by the apparatus. Moreover, every pixel of the radiation detector apparatus comprises the following components:

a) A conversion element for the conversion of incident radiation into free charges (for example electrons or electron-hole pairs in a semiconductor).
b) A charge storage element for the intermediate storage of said free charges produced by the conversion element. The charge storage element comprises a charge storage region and a photogate electrode which is disposed on the charge storage region and at the same time electrically isolated from the charge storage region, the electrode being capable of inducing an electrical field in the charge storage region.
c) A photogate line that connects the photogate electrode with an external driver circuit.
d) At least one readout element for the selective conversion of the charges stored in the charge storage element into an electrical signal (e.g. a charge or a voltage) on an output line of the pixel.

Furthermore, at least one of the photogate lines of the radiation detector apparatus contains a current sensor for detecting displacement currents that are caused by changes in the charge of a charge storage element coupled to that photogate line. Typically all photogate lines are individually provided with such a current sensor so that displacement currents from all pixels can be monitored.

When the described radiation detector apparatus is exposed to radiation, free charges are generated in the conversion element and stored in the charge storage element. After completion of the exposure the charges can be read out from the storage by the readout element as image signals. With the help of the current sensors in the photogate lines it is possible to monitor the collection of charges in the charge storage elements already during the ongoing illumination, because the displacement currents caused by these processes are measured. This information may particularly be used for an optimal control of the illumination. For example an X-ray source may be switched off as soon as a region of interest has been illuminated enough.

The displacement currents measured in a photogate line are additively caused by the photogate electrodes that are connected to that line. In principle it is possible to connect the photogate electrode of only one pixel to a given photogate line. In this case the build-up of charge in one specific pixel can be monitored. In a preferred embodiment, however, more than one pixel is connected to a photogate line that contains a current sensor. In this way the build-up of charges is observed in all connected pixels simultaneously. This is sufficient or even advantageous for dose control since in this case the illumination of larger regions is of primary interest. Furthermore, photogate lines can be saved and signal strength can be increased by connecting several pixels to one line. Preferably all of the pixels connected to the same photogate line are neighbouring. In particular the group of these pixels may have a compact geometrical form, e.g. like a block of n×m pixels (n, m=2, 3, . . . ).

Preferably the external driver circuit(s) to which the photogate lines are connected is (are) capable of applying a constant voltage to the photogate electrodes that are coupled to a photogate line. A constant voltage of the photogate electrodes guarantees that the electrical field induced by them in the charge storage region remains the same. Thus constant conditions prevail in every connected pixel during an illumination. Since the amount of accumulated charges in the charge storage elements changes during an illumination, corresponding displacement currents must flow for the stabilization of the voltage in the photogate line. These currents can be measured by the current sensors, their size being a direct measure for the change of the charge in the charge storage elements.

There are different possibilities for the realization of the current sensors. In particular the current sensors may contain charge-sensitive amplifiers. A typical charge sensitive amplifier may comprise a differential amplifier, a capacitor, and a switch.

The charge storage region is preferably made of a semiconductor, in particular of crystalline silicon.

The conversion element of the pixels in the radiation detector apparatus may be sensitive for electromagnetic radiation of any kind. In particular the conversion element may be sensitive to visible light and/or to X-rays. In this case the radiation detector apparatus is suited for the realization of a camera and/or an X-ray device.

If the detector apparatus is used for the detection of X-rays, a direct or indirect conversion of the radiation into electric signals may be carried out. In case of an indirect conversion, a conversion element sensitive to visible light typically is combined with a scintillation layer which converts incident X-ray quanta into photons of visible light. In a second step these photons then create free charges in the conversion element as an electrical signal.

The invention further concerns an X-ray examination apparatus comprising the following components:

an X-ray source for exposing an object to be examined to X-ray energy; and an X-ray detector apparatus of the kind explained above for receiving an X-ray image after attenuation by the object to be examined.

Furthermore the invention concerns a method for controlling an X-ray examination apparatus of the kind explained above. The method comprises the following steps:

Exposing the object to be examined to X-radiation.

Monitoring output signals of current sensors during the X-ray exposure, the current sensors being inserted into photogate lines as described above.

Halting the X-ray exposure in response to said monitoring of the output signals of current sensors.

Reading out the charges stored on the charge storage elements of the detector pixels to obtain an X-ray image.

With the method it is possible to produce X-ray images that are optimally illuminated in regions of interest. Thus both the quality of the resulting images can be improved and the exposure of the patient to radiation can be minimized, the latter because overexposed images and underexposed images and the associated re-takes are avoided.

The invention further concerns a method for monitoring the dose which was collected by at least one pixel of a radiation detector apparatus, the pixel containing the following components:

a) A conversion element for the conversion of incident radiation into free charges (for example electrons or electron-hole pairs in a semiconductor).

b) A charge storage element for the intermediate storage of said free charges produced by the conversion element. The charge storage element comprises a charge storage region and a photogate electrode which is disposed on the charge storage region and at the same time electrically isolated from the charge storage region, the electrode being capable of inducing an electrical field in the charge storage region.

c) A photogate line that connects the photogate electrode with an external driver circuit.

d) At least one readout element for the selective conversion of the charges stored in the charge storage element into an electrical signal on an output line of the pixel.

According to the method displacement currents are measured in at least one of the photogate lines. The displacement currents are caused by changes in the charging of a charge storage element which is connected to said line. The method comprises in general form the steps that can be executed with a radiation detector apparatus of the kind described above. Therefore, reference is made to the preceding description for more information on the details, advantages and improvements of the method.

In summary, one basic idea of the present invention is to measure displacement currents which are induced by charge build-ups under a photogate electrode during an ongoing exposure, the displacement currents being a measure of the radiant energy absorbed by the respective pixel.

These and other aspects of the invention will be apparent from and elucidated with reference to the embodiment(s) described hereinafter.

In the following the invention is described by way of example with the help of the accompanying drawings in which.

Figure 1:
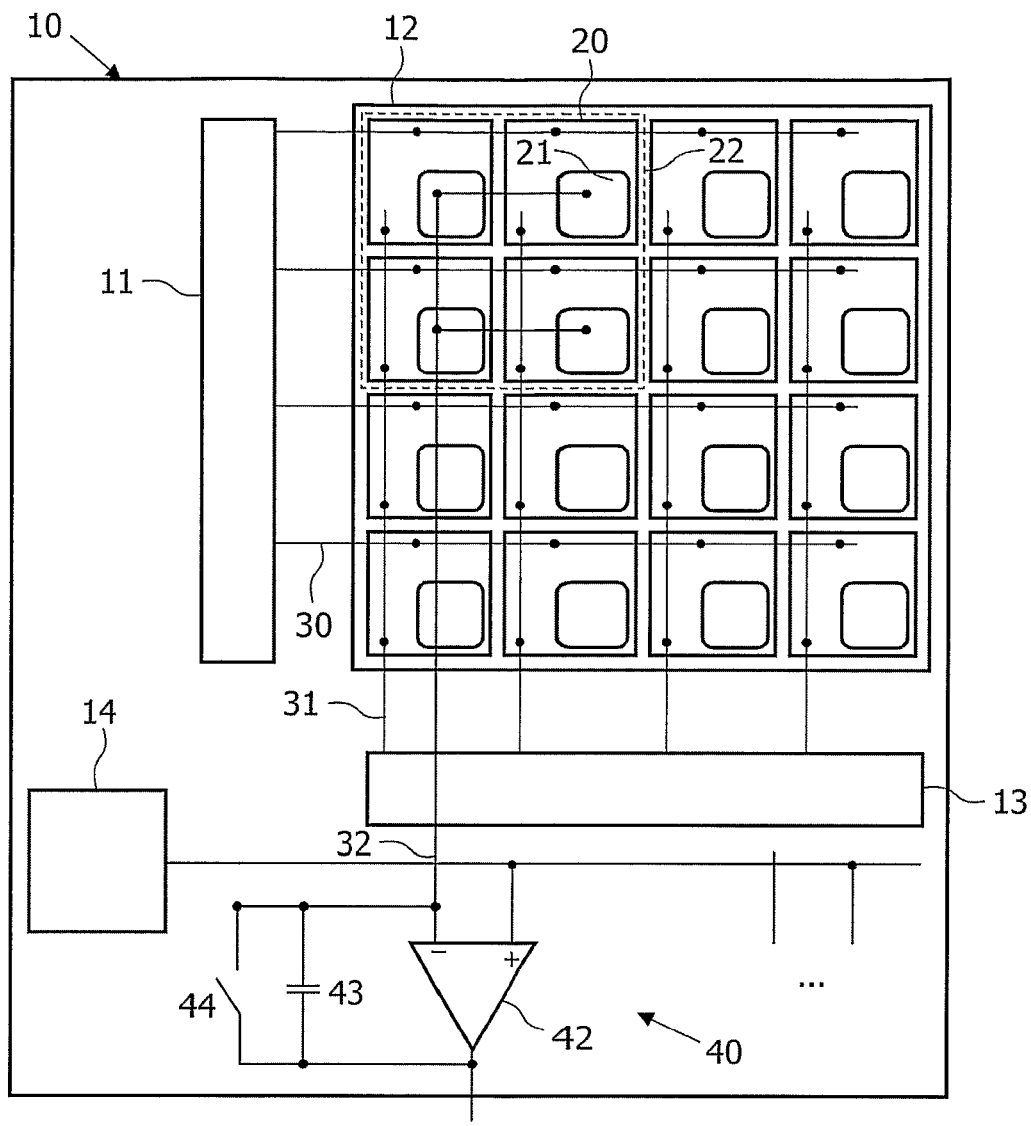
FIG. 1 shows schematically the layout of a radiation detector apparatus according to the present invention.

FIG. 1 depicts a flat dynamic X-ray detector (FDXD) 10 with an array 12 of pixels 20 arranged in a rectangular matrix. The pixels 20 are assumed to be sensitive to X-rays. However, the invention is also applicable for optical image sensors in which the pixels are sensitive to visible light. Moreover it should be noted that for reasons of representation only a few pixels 20 are shown in the Figure. Typically a FDXD contains several hundred thousands of such pixels.

The radiation detector apparatus 10 comprises an addressing circuit 11 from which address lines 30 run row-wise across the matrix 12. All pixels 20 of one row are connected to the same address line 30. By activating all address lines 30 sequentially with the help of the logic 11, all pixels 20 of the array 12 can be read out. During such a readout process the sensor signals of the pixels 20 are fed row by row to the readout lines 31 which run parallel to the columns of the matrix 12. At the lower end of the matrix 12 each readout line 31 is connected to a readout logic 13, where further processing (amplification, analog-digital-conversion, multiplexing etc.) of the image signals takes place.

Figure 2:
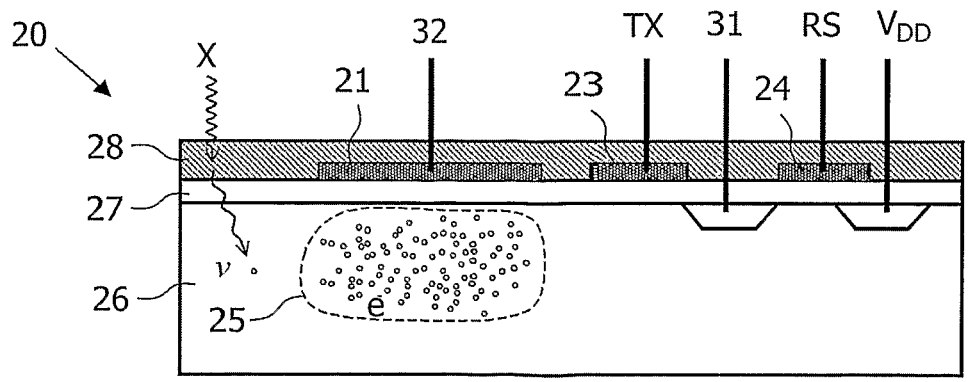
FIG. 2 shows schematically a sectional view through a pixel of the detector of FIG. 1.

A pixel 20 is shown in more detail in the sectional view of FIG. 2. The pixel is built up on a semiconductor bulk material 26, preferably on monocrystalline silicon and in CMOS technology. The design is that of a so-called photogate pixel (cf. U.S. Pat. No. 6,555,842 B1) with indirect conversion. In a scintillation layer 28 on top of the whole pixel, incident X-rays X are converted into quanta v of visible light. These quanta free electrical charges in the bulk material 26 which thus serves as a conversion element. These charges then concentrate in a region 25 of the bulk material serving as a charge storage region. A minimum of the electrical potential is created in this storage region 25 by an electrical field that originates from a photogate electrode 21. Thus the storage region 25 and the photogate electrode 21 together constitute a charge storage element of the pixel. The photogate electrode 21 is disposed on an isolating layer 27 above the bulk material 26 and connected with an external photogate driver circuit 14 (FIG. 1) via a photogate line 32.

After the illumination process for an exposure is completed, the voltage of the photogate electrode 21 is changed, and the stored charges are driven out of the area 25. A suitable voltage of a transfer electrode 23 guarantees that the charges flow to a collector electrode and from there via a readout line 31 to the external circuits. Furthermore a reset-electrode 24 is provided with which the charge storage region 25 can be put into a defined initial state. According to an alternative readout procedure (not shown), the charge stored in area 25 is converted into a corresponding voltage with the help of a capacitor. This voltage may then be applied to the readout line 31 via a source follower and a readout switch.

The electrodes 21, 23, 25 mentioned above are preferably made of a transparent material like ITO (Indium Tin Oxide) in order to allow free passage of optical photons v from the scintillation layer 28 to the bulk material 27.

In known radiation detectors of the kind described above the photogate electrodes are connected column by column to photogate lines that directly lead to the external photogate driver circuit 14. According to the present invention, however, every photogate line 32 is associated with a measuring array 22 of several neighbouring pixels 20. As shown in FIG. 1, the measuring arrays 22 may consist for example of blocks of 2×2 pixels. Of course larger measuring arrays and other geometries are possible, too, a typical area of a measuring array being approx. 1 cm². The photogate line 32 that is common to the pixels 20 of a measuring array 22 is connected to the inverting input of a differential amplifier 42. The non-inverting input of this amplifier 42 is connected to the photogate driver circuit 14. The photogate driver circuit 14 typically produces a constant voltage during an illumination process. Furthermore the inverting input of the amplifier 42 is connected via a capacitor 43 and a switch 44 (optional) with the output of the amplifier. The whole unit of the elements 42, 43, and 44 constitutes a charge sensitive amplifier which is one possible implementation of a current sensor 40. It should be noted that similar photogate lines and amplification circuits exist for each measuring array of the chip, though only one of them is shown in FIG. 1 by way of example.

If charges are collected under the photogate electrodes 21 of the pixels of a measuring array 22, the photogate driver circuit 14 must transport corresponding mirror charges to the photogate electrodes 21 in order to hold the voltage of these electrodes constant. These so-called displacement currents can be sensed by the charge sensitive amplifier 40. Thus, the voltage at the output of the charge sensitive amplifier 40 is proportional to the charge accumulated under all photogate electrodes 21 in the measuring array 22 and therefore also proportional to the radiation dose absorbed in the measuring array 22.

By closing the switch 44 the capacitor 43 can be discharged and thus the current sensor 40 can be reset. In the described circuit with the charge-sensitive amplifier 40 the voltage at the photogate electrodes 21 is determined only by the voltage at the exit of the photogate driver circuit 14. Thus the insertion of the current sensor 40 does not change the normal behaviour of the sensor elements and the operation of the radiation detector apparatus 10.

The measuring of the displacement currents by the current sensors 40 allows however to monitor the absorbed radiation dose during an ongoing exposure in the respective measuring arrays 22. In this way it is possible to specifically control the illumination in certain regions of interest with respect to an optimization of contrast. Thus for example an X-ray source can be switched off as soon as the region of interest has received an optimal dose. Further details and advantages of a radiation detector apparatus that allows a monitoring of dose during illumination are described in WO 02/25314 A1 which is included completely into the present application by reference. Furthermore different possibilities are described in this document to route the dose readout lines across the sensor surface. These routings are also applicable for the photogate lines 32 of the present case.

Finally it is pointed out that in the present application the term "comprising" does not exclude other elements or steps, that "a" or "an" does not exclude a plurality, that the terms "connect" and "connection" include both direct and indirect connections, and that a single processor or other unit may fulfill the functions of several means. Moreover, reference signs in the claims shall not be construed as limiting their scope.

The invention claimed is:

1. Radiation detector apparatus with an array of detector pixels, wherein each pixel comprises: a) a conversion element for the conversion of incident radiation into free charges; b) a charge storage element for the storage of said free charges, comprising a charge storage region and a photogate electrode being disposed on and electrically isolated from the charge storage region for inducing an electrical field in it; c) a photogate line that connects the photogate electrode to an external driver circuit; d) readout elements for the selective conversion of the charges stored in the charge storage element, into an electrical signal on an output line of the pixel; and wherein at least one of the photogate lines is connected to the corresponding external driver circuit via a current sensor for detecting displacement currents that are caused by changes in the charge of a charge storage element coupled to that line.

2. Radiation detector apparatus according to claim 1, wherein at least one group of neighbouring pixels is coupled to the same photogate line and current sensor.

3. Radiation detector apparatus according to claim 1, wherein the external driver circuit is capable of applying a constant voltage to the photogate electrodes coupled to it.

4. Radiation detector apparatus according to claim 1, wherein the current sensor comprises a charge-sensitive amplifier.

5. Radiation detector apparatus according to claim 1, wherein the charge storage region is made of a semiconductor, preferably of crystalline silicon.

6. Radiation detector apparatus according to claim 1, wherein the conversion element is sensitive to visible light and/or X-radiation.

7. Radiation detector apparatus according to claim 6, wherein each pixel comprises a scintillation layer for converting incident X-rays (X) into optical photons.

8. An X-ray examination apparatus comprising: an X-ray source for exposing an object to be examined to X-ray energy; and an X-ray detector apparatus as claimed in claim 1, for receiving an X-ray image after attenuation by the object to be examined.

9. A method for controlling an X-ray examination apparatus according to claim 8, comprising: exposing the object to be examined to X-radiation; monitoring output signals of the current sensors during the X-ray exposure; halting the X-ray exposure in response to the signal monitoring; and reading out the charges stored in the charge storage elements to obtain an X-ray image.

10. A method for monitoring the dose collected by at least one pixel of a radiation detector apparatus, the pixel comprising: a) a conversion element for the conversion of incident radiation into free charges; b) a charge storage element for the storage of said free charges, comprising a charge storage region and a photogate electrode being disposed on and electrically isolated from the charge storage region for inducing an electrical field in it; c) a photogate line that connects the photogate electrode to an external driver circuit; d) readout elements for the selective conversion of the charges stored in the charge storage element into an electrical signal on an output line of the pixel; wherein displacement currents are sensed in at least one photogate line the displacement currents being induced by changes in the charging of charge storage elements connected to said line.

* * * * *